United States Patent
Qiu et al.

(10) Patent No.: US 10,026,904 B2
(45) Date of Patent: Jul. 17, 2018

(54) ORGANIC LIGHT EMITTING DEVICES

(71) Applicants: Kunshan Visionox Technology Co., Ltd., Kunshan (CN); Tsinghua University, Beijing (CN)

(72) Inventors: Yong Qiu, Beijing (CN); Kongwu Wu, Kunshan (CN); Guohui Zhang, Beijing (CN); Lian Duan, Beijing (CN)

(73) Assignees: KUNSHAN VISIONOX TECHNOLOGY CO., LTD., Kunshan, Jiangsu Province (CN); TSINGHUA UNIVERSITY, Beijing (CN)

(*) Notice: Subject to any disclaimer, the term of this patent is extended or adjusted under 35 U.S.C. 154(b) by 304 days.

(21) Appl. No.: 14/886,282

(22) Filed: Oct. 19, 2015

(65) Prior Publication Data
US 2016/0043324 A1 Feb. 11, 2016

Related U.S. Application Data

(63) Continuation of application No. 12/327,365, filed on Dec. 3, 2008, now Pat. No. 9,196,856.

(30) Foreign Application Priority Data

Jan. 29, 2008 (CN) .......................... 2008 1 0057016

(51) Int. Cl.
*H01L 51/50* (2006.01)
*H01L 51/00* (2006.01)
(Continued)

(52) U.S. Cl.
CPC ........ *H01L 51/0058* (2013.01); *C09K 11/025* (2013.01); *C09K 11/06* (2013.01);
(Continued)

(58) Field of Classification Search
None
See application file for complete search history.

(56) References Cited

U.S. PATENT DOCUMENTS

| 6,475,648 B1 | 11/2002 | Hatwar et al. |
| 6,967,062 B2 | 11/2005 | Hatwar et al. |

(Continued)

FOREIGN PATENT DOCUMENTS

| CN | 1346233 A | 4/2002 |
| CN | 1592526 A | 3/2005 |

(Continued)

OTHER PUBLICATIONS

European Office Action for Corresponding European Patent Application No. 08020968.7, dated Dec. 23, 2015.
(Continued)

*Primary Examiner* — Gregory D Clark
(74) *Attorney, Agent, or Firm* — Merchant & Gould P.C.

(57) ABSTRACT

The present invention relates to monochromatic organic light emitting devices. The organic light emitting device includes a substrate, an anode, a cathode and an organic electroluminescent medium disposed between the anode and the cathode, wherein the organic electroluminescent medium includes compound monochromatic luminescent layer; and the compound monochromatic luminescent layer includes host A doped with monochromatic dopant and host B doped with monochromatic dopant, wherein the host A is consisted of two kinds of materials with different transporting characteristics, one is hole-transporting material, and the other is electron-transporting material. In addition, the present invention further relates to white organic light emitting devices, wherein the organic electroluminescent medium is consisted of at least one compound monochromatic luminescent layer, which includes host A doped with monochromatic dopant and host B doped with monochromatic dopant.

(Continued)

The present invention provides a design to improve the lifetime of the organic light emitting device markedly.

12 Claims, 5 Drawing Sheets

(51) Int. Cl.
  *H01L 51/52* (2006.01)
  *C09K 11/02* (2006.01)
  *C09K 11/06* (2006.01)
(52) U.S. Cl.
  CPC ........ *H01L 51/006* (2013.01); *H01L 51/0081* (2013.01); *H01L 51/5036* (2013.01); *H01L 51/5278* (2013.01); *C09K 2211/1011* (2013.01); *C09K 2211/1014* (2013.01); *H01L 51/504* (2013.01); *H01L 51/5028* (2013.01); *H01L 51/5056* (2013.01); *H01L 51/5072* (2013.01); *H01L 2251/5384* (2013.01); *H01L 2251/562* (2013.01); *Y02B 20/181* (2013.01)

(56) References Cited

U.S. PATENT DOCUMENTS

| | | |
|---|---|---|
| 7,264,843 B2 | 9/2007 | Ohshita et al. |
| 7,663,304 B2 | 2/2010 | Fukuoka et al. |
| 2005/0147844 A1 | 7/2005 | Hatwar et al. |
| 2005/0194892 A1 | 9/2005 | Lu |
| 2005/0221121 A1 | 10/2005 | Ishihara et al. |
| 2006/0003184 A1 | 1/2006 | Hatwar et al. |
| 2006/0040132 A1 | 2/2006 | Liao et al. |
| 2006/0051497 A1 | 3/2006 | Hamada et al. |
| 2006/0063032 A1 | 3/2006 | Matsusue |
| 2006/0194074 A1 | 8/2006 | Funahashi |
| 2006/0194076 A1 | 8/2006 | Nariyuki |
| 2006/0289882 A1 | 12/2006 | Nishimura et al. |
| 2007/0057630 A1 | 3/2007 | Nishita et al. |
| 2007/0099026 A1 | 5/2007 | Lee et al. |
| 2007/0100179 A1 | 5/2007 | Lai et al. |
| 2007/0228938 A1 | 10/2007 | Hatwar et al. |
| 2008/0020234 A1 | 1/2008 | Ren et al. |
| 2008/0061685 A1 | 3/2008 | Chesterfield |
| 2009/0108734 A1 | 4/2009 | Begley et al. |
| 2009/0302313 A1 | 12/2009 | Choi et al. |

FOREIGN PATENT DOCUMENTS

| | | |
|---|---|---|
| CN | 1678142 A | 10/2005 |
| CN | 1678150 A | 10/2005 |
| CN | 1791289 A | 6/2006 |
| JP | 2001-338761 A | 12/2001 |
| JP | 2005-285708 A | 10/2005 |
| JP | 2007-027092 A | 2/2007 |
| JP | 2007-042875 A | 2/2007 |
| JP | 2007-520060 A | 7/2007 |
| KR | 10-2005-0001426 A | 1/2005 |
| KR | 2005-0086729 A | 8/2005 |
| KR | 10-2008-0088208 A | 10/2008 |
| WO | 20061023322 A1 | 3/2006 |
| WO | 20061028546 A1 | 3/2006 |
| WO | 2006/075822 A1 | 7/2006 |
| WO | 20061082705 A1 | 8/2006 |
| WO | 20071126752 A1 | 11/2007 |

OTHER PUBLICATIONS

Summons from the European Patent Office for Corresponding European Patent Application No. 08020968.7, dated Sep. 14, 2016.
Tang et al.: "Organic electroluminescent diodes," Applied Physics Letters, American Institute of Physics, vol. 51, No. 12, Sep. 21, 1987, pp. 913-915.
Korean Office Action for corresponding Korean Patent Application No. 10-2008-0131595, dated Dec. 29, 2010.
Extended European Search Report for corresponding European Patent Application No. 08020968.7, dated Apr. 14, 2011.
Korean Notice of Allowance and Granted Documents for corresponding Korean Patent Application No. 10-2008-0131595, dated Mar. 10, 2011.

ORGANIC LIGHT EMITTING DEVICES

This application is a Continuation Application of U.S. patent application Ser. No. 12/327,365, filed 3 Dec. 2008, which claims benefit of Serial. No 200810057016.0, filed 29 Jan. 2008 in China and which applications are incorporated herein by reference. To the extent appropriate, a claim of priority is made to each of the above disclosed applications.

FIELD OF INVENTION

The present invention relates to organic light emitting devices, and more particularly, to monochromatic organic light emitting devices for improving the lifetime markedly, and further relates to white organic light emitting devices for improving the lifetime markedly.

BACKGROUND OF THE INVENTION

Organic light emitting devices have attracted a lot of interests because of the advantages such as thin, large-plane, solid-state and flexible, wherein white organic light emitting devices have become focus due to demonstrated applications in the solid-state light source or as backlight for liquid crystal displays.

Bernanose. A et al. have began the studies on organic light emitting devices (hereinafter, organic light emitting device is often abbreviated as "OLED") since 1950s, and the initial material was anthracene, because the thickness was so large and resulted in that the drive voltage was too high. Until the year 1987, a low-weight molecule OLED with the structure of ITO/Diamine/Alq$_3$/Mg:Ag was reported by C. W. Tang and Vanslyke of Eastman Kodak Co. in USA, and the luminance of the device was up to 1000 cd/m$^2$ at the drive voltage 10V at that time, and the external quantum efficiency was 1.0%. The studies on the electroluminescent devices have attracted a lot of interests of scientists, which indicated the probabilities of applications in displays. And then the studies and the industrializations of OLEDs as prelude are opened.

The high efficiency, high luminescent intensity and color stability of OLEDs are particularly significant to their industrializations. Recent years, phosphorescent materials are introduced to OLEDs which result in that the triplet and singlet excitons are fully used, and so that the luminescent intensity and efficiency are improved markedly. However, the lifetime of blue devices and blue emitting layer of devices is the key problem combining the characteristics of OLEDs, and ways of developing long-lifetime blue materials and optimizing the structures of OLEDs are used to improve the lifetime. At the structure optimization aspect, the Chinese patent document 200510007765.9 and 200510007786.0 of sanyo disclosed a device where the lifetime was improved through introducing two kinds of dopants, and the Chinese patent document 01120883.X of Eastman Kodak disclosed a device where the lifetime was as well improved by introducing the first dopant which could accept electron-hole energy from host and the second dopant which could accept energy from hole of host. The doped luminescent layers above are all doped in single luminescent layer, and the disadvantage is the low efficiency.

SUMMARY OF THE INVENTION

It is an object of the embodiments to provide a monochromatic organic light emitting device with improved lifetime.

It is a further object of the embodiments to provide a white organic light emitting device with improved lifetime.

These objects are achieved by the following methods:

In one aspect, a monochromatic organic light emitting device, comprising:
a) a substrate;
b) an anode;
c) a cathode;
d) organic electroluminescent medium disposed between the anode and cathode;
wherein the organic electroluminescent medium comprises a compound monochromatic luminescent layer including host A doped with monochromatic dopant and host B doped with monochromatic dopant,
wherein the host A includes two kinds of materials with different transporting characteristics, one is hole-transporting material, and the other is electron-transporting material.

Wherein the compound monochromatic luminescent layer includes either of blue emitting layer, green emitting layer, red emitting layer, or yellow emitting layer.

Wherein the hole-transporting material includes triarylamine, carbazole derivatives and pyrazolin derivatives.

Wherein the chemical structure of the hole-transporting material is represented by the following formula ①-③:

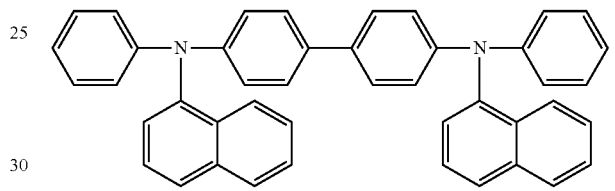

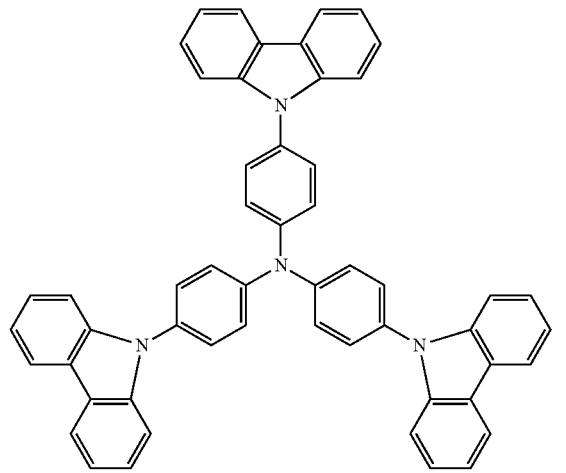

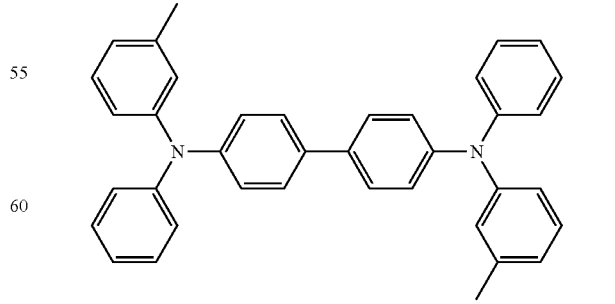

Wherein the electron-transporting material includes anthracene, oxadiazole derivative, metal chelates and conjugated polycyclic aromatic compounds.

Wherein the chemical structure of the electron-transporting material is represented by the following formula ④-⑦:

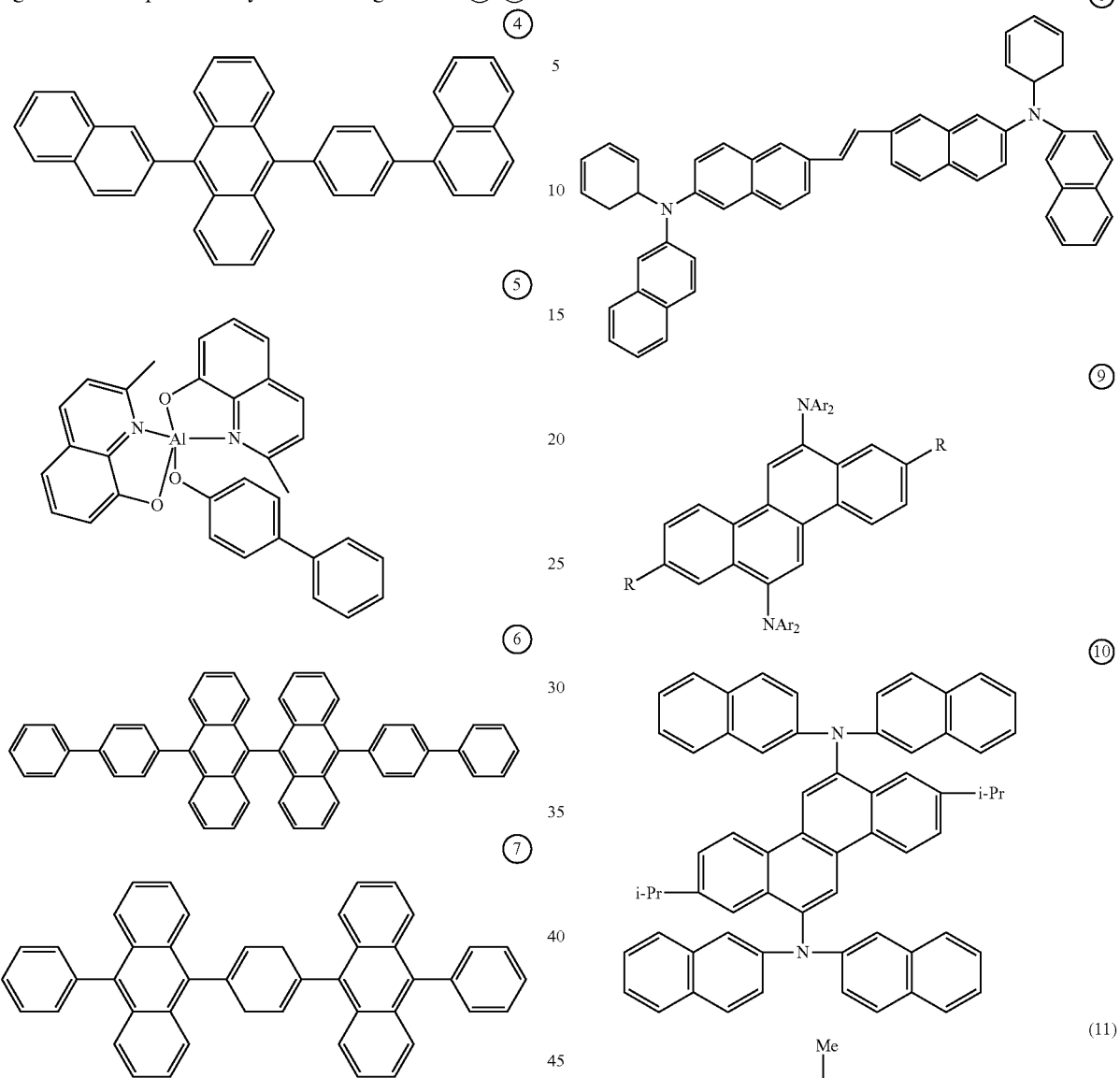

Wherein one of the host A and the dopant thereof are the same as the host B and the dopant thereof.

Wherein the host A can be a single material with both the hole-transporting characteristic and the electron-transporting characteristic, such as CBP, and the chemical structure of CBP as follows:

Wherein the host A doped with monochromatic dopant could be adulterated with auxiliary materials, and the auxiliary material could be another monochromatic dopant.

Wherein the monochromatic luminescent layer is blue emitting layer, and the chemical structure of the blue dopant is represented by the following formula ⑧-(13):

-continued (12)

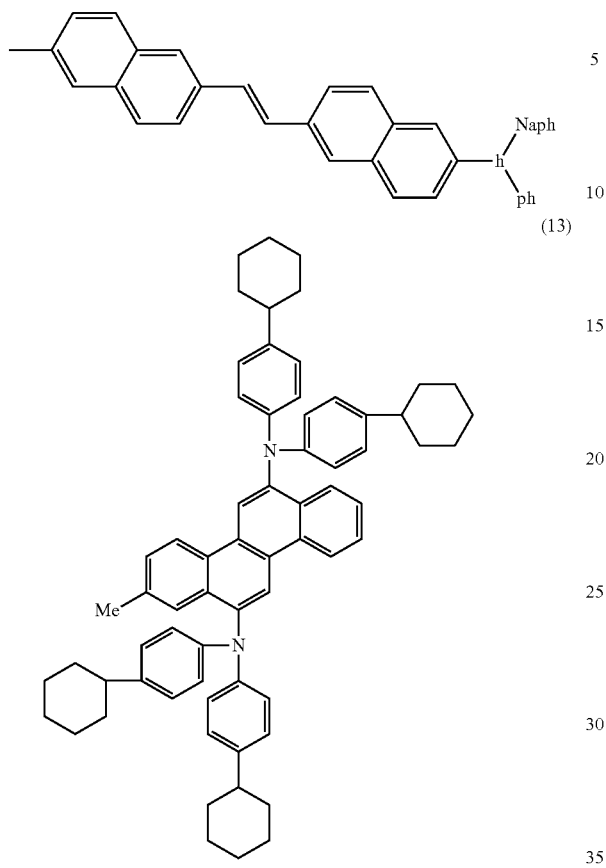

(13)

Wherein the organic electroluminescent medium includes one or more of hole-injection layer, hole-transporting layer, electron-injection layer and electron-transporting layer.

In another aspect, a white organic light emitting device, comprising:
a) a substrate;
b) an anode;
c) a cathode;
d) organic electroluminescent medium disposed between the anode and cathode;
wherein the organic electroluminescent medium at least comprises one compound monochromatic light emitting layer including host A doped with monochromatic dopant and host B doped with monochromatic dopant.
wherein the host A includes two kinds of materials with different transporting characteristics, one is hole-transporting material, and the other is electron-transporting material.
Wherein the compound monochromatic luminescent layer includes either of the blue emitting layer, green emitting layer, red emitting layer, or yellow emitting layer.
Wherein the hole-transporting material includes tri-arylamine, carbazole derivatives and pyrazolin derivatives.
Wherein the chemical structure of the hole-transporting material is represented by the following formula ①-③:

①

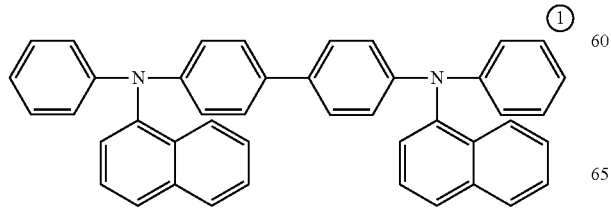

-continued

②

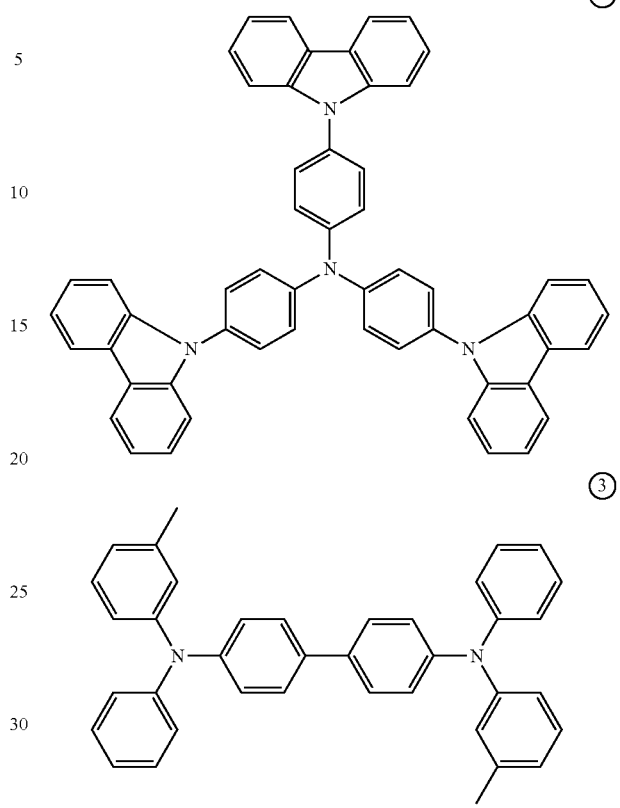

③

Wherein the electron-transporting material includes anthracene, oxadiazole derivative, metal chelates and conjugated polycyclic aromatic compounds.

Wherein the chemical structure of the electron-transporting material is represented by the following formula ④-⑦:

④

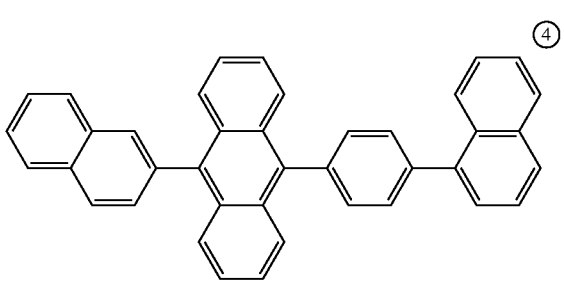

⑤

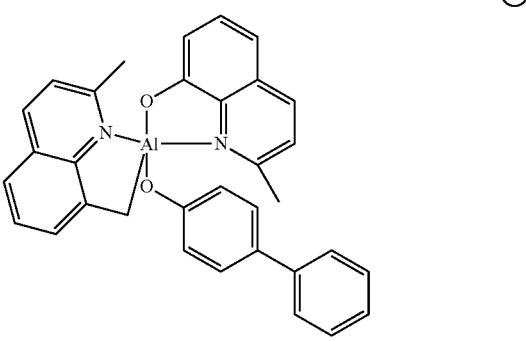

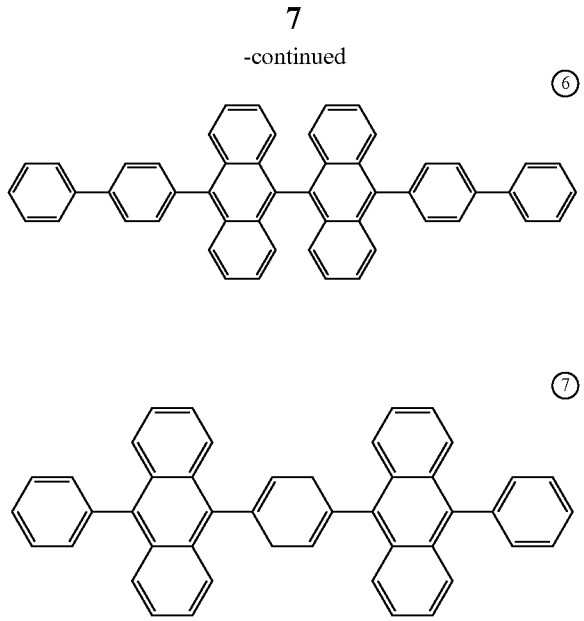

Wherein one of the host A and the dopant thereof are the same as the host B and the dopant thereof.

Wherein the host A can be a single material with both the hole-transporting characteristic and the electron-transporting characteristic, such as CBP, the chemical structure of CBP in (14).

Wherein the organic electroluminescent medium includes compound blue emitting layer, green emitting layer and red emitting layer.

Wherein the organic electroluminescent medium includes compound blue emitting layer and yellow emitting layer.

Wherein the organic electroluminescent medium includes compound green emitting layer, blue emitting layer and red emitting layer.

BRIEF DESCRIPTION OF THE DRAWINGS

01 substrate, 02 anode, 03 cathode, 04 hole-injection layer, 05 hole-transporting layer, 06 blue emitting layer 1 (with host A), 07 blue emitting layer 2 (with host B), 08 electron-transporting layer, 09 luminescent layer

01 substrate, 02 anode, 03 cathode, 04 hole-injection layer, 05 hole-transporting layer, 06 green emitting layer 1 (with host A), 07 green emitting layer 2 (with host B), 08 electron-transporting layer, 09 luminescent layer

01 substrate, 02 anode, 03 cathode, 04 hole-injection layer, 05 hole-transporting layer, 12 yellow emitting layer, 06 blue emitting layer 1, 07 blue emitting layer 2, 08 electron-transporting layer, 09 luminescent layer

01 substrate, 02 anode, 03 cathode, 04 hole-injection layer, 05 hole-transporting layer, 11 green emitting layer, 06 blue emitting layer 1, 07 blue emitting layer 2, 13 red emitting layer, 08 electron-transporting layer, 09 luminescent layer

DESCRIPTION OF THE PREFERRED EMBODIMENTS

Figure 1:
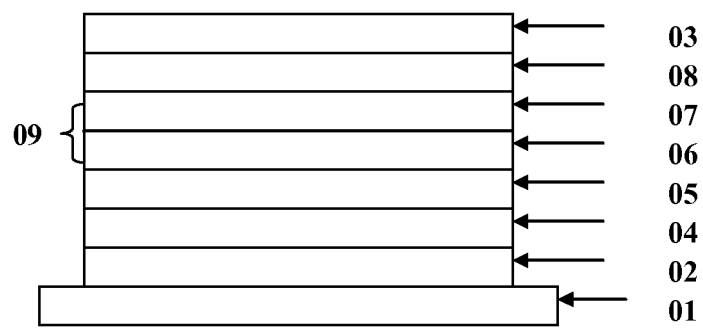
FIG. 1 shows a cross-sectional representation of one embodiment of the structure of the blue organic light emitting device, comprising.

The structure of the organic light emitting device in the present invention is shown in FIG. 1, wherein 01 is substrate which can be a glass substrate or a flexible substrate made of polyethylene terephthalate or polyimide material.

02 is anode which can be inorganic material or organic conducting polymer. The inorganic material is commonly made of metal oxide such as such as indium-tin oxide (ITO), zinc oxide and tin-zinc oxide or some metals with high work function such as aurum (Au), copper and argentums (Ag), and a preferable anode is ITO film. The preferable organic conducting polymer anode is polyethylene dioxythiophene (PEDOTPSS for short) or PANI films.

03 is cathode which can be a metal material with low work function selected from lithium (Li), magnesium (Mg), calcium (Ca), Strontium (Sr), aluminum (Al), indium (In) and their alloy with copper, aurum (Au) or argentums (Ag). The cathode can also be metal and metal fluoride alternately, and a preferable cathode layer is LiF and Al.

04 is hole-injection layer (unnecessary). The host material can be CuPc, and the inorganic material can be halide and oxide of bismuth.

05 is hole-transporting layer. The host material can be aromatic amine and graft polymer. A preferable material is NPB. The inorganic material can be halide or oxide of bismuth.

09 is the luminescent layer selected from low molecular weight compounds generally. The luminescent layer can be fluorescent materials such as $Alq_3$, $Gaq_3$, Al (Saph-q) or Ga (Saph-q), which is doped with either of fused-ring aromatic compounds (such as rubrene), coumarin (such as DMQA, C545T) or di-pyran (such as DCJTB, DCM), and the concentration is in the range of from 0.01 wt % to 20 wt %. In addition, the luminescent material can also be carbazole derivatives such as CBP, PVK, which is doped with phosphorescent material, such as $Ir(ppy)_3$, $Ir(ppy)_2(acac)$ or PtOEP.

08 is electron-transporting layer, commonly selected from low molecular weight electron-transporting materials containing organic metal complex (such as $Alq_3$, $Gaq_3$, Al (Saph-q), BAlq or Ga (Saph-q)), fused-ring aromatic compounds (such as pentacene, perylene) or o-phenanthroline (such as Bphen, BCP).

Next described are some examples and FIGS aimed to explain the technique scheme of the present invention, wherein the examples are only used to understand this invention well, but not limited to this invention.

EXAMPLE 1

A blue light emitting device is reported in Example 1 and the device structure is shown in FIG. 1, wherein the luminescent layer 09 is compound blue emitting layer containing two layers 06 and 07. The blue emitting layer 1(06) contains host A doped with blue dopant where the host A is formed by two kinds of materials with different transporting characteristics, one of which is electron-transporting material represented by the following formula 4 (BH1 for short):

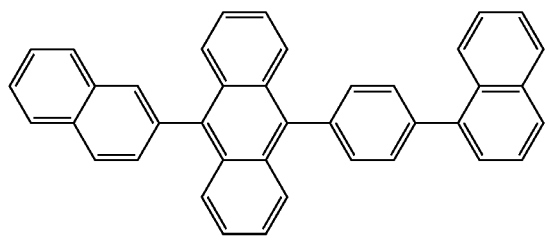

The other is hole-transporting material represented by the following formula ① (NPB for short):

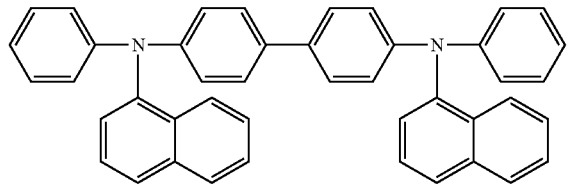

The formula of the blue dopant is ⑧ (BD1 for short):

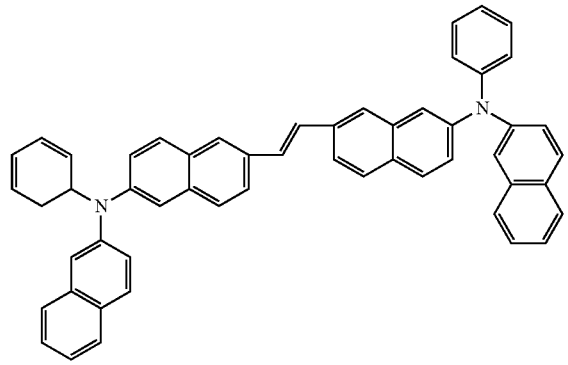

The blue emitting layer 2(07) is formed by a host B and a blue dopant, where the host B is electron-transporting material and the blue dopant is BD1, and the device has the following device structure:

$$\text{ITO/NPB/BH1:NPB:BD1/BH1:BD1/Alq}_3\text{/LiF/Al} \quad (1)$$

The device of device structure (1) is fabricated by the following procedures successively:

1) A transparent glass substrate is cleaned ultrasonically with boiling scour water and deionized (DI) water. Then the substrate is dried under infra-red lamp. An anode material is deposited on the cleaned glass as an anode layer and the thickness of it is 180 nm.

2) The cleaned anode film-coated glass substrate is put in the vacuum of about $1\times10^{-5}$ Pa, then a NPB film is vapor-deposited as a hole-transporting layer on the anode layer. The deposition rate is about 0.1 nm/s and the resulting NPB layer thickness is about 20 nm 3) The blue emitting layer 1 is vapor-deposited on the hole-transporting layer through the method of evaporating three materials at the same time. The weight ratio of NPB and BD1 to BH1 is respectively 20% and 3% and the thickness of this layer is 10 nm 4) The blue emitting layer 2 is subsequently vapor-deposited on the blue emitting layer 1 through the method of evaporating two materials at the same time. The deposition rate of BH1 is 0.2 nm/s and the weight ratio of BD1 to BH1 is 3%, and the thickness of this layer is 20 nm 5) An $Alq_3$ film is subsequently vapor-deposited on the blue emitting layer 2 as electron-transporting layer. The deposition rate is 0.2 nm/s and the thickness of it is 50 nm.

6) Finally, a LiF layer and an Al layer, in sequence, are vapor-deposited as cathode on the above layers. The deposition rate of LiF is 0.01~0.02 nm/s, and the layer thickness is 0.7 nm The deposition rate of Al is 2.0 nm/s, and the thickness of it is 150 nm

COMPARATIVE EXAMPLE 1

The device has the following device structure:

$$\text{IOT/NPB/BH1:BD1/Alq}_3\text{/LiF/Al} \quad (2)$$

The device of device structure (2) is fabricated by the following procedures successively:

The device of device structure (2) is fabricated with the same procedures as above described towards the device structure (1), except for cancelling the blue light emitting layer 1.

COMPARATIVE EXAMPLE 2

The device has the following device structure:

$$\text{ITO/NPB/BH1:NPB:BD1/Alq}_3\text{/LiF/Al} \quad (3)$$

The device of device structure (3) is fabricated by the following procedures successively:

The device of device structure (3) is fabricated with the same procedures as above described towards the device structure (1), except for cancelling the blue light emitting layer 2.

Figure 5:
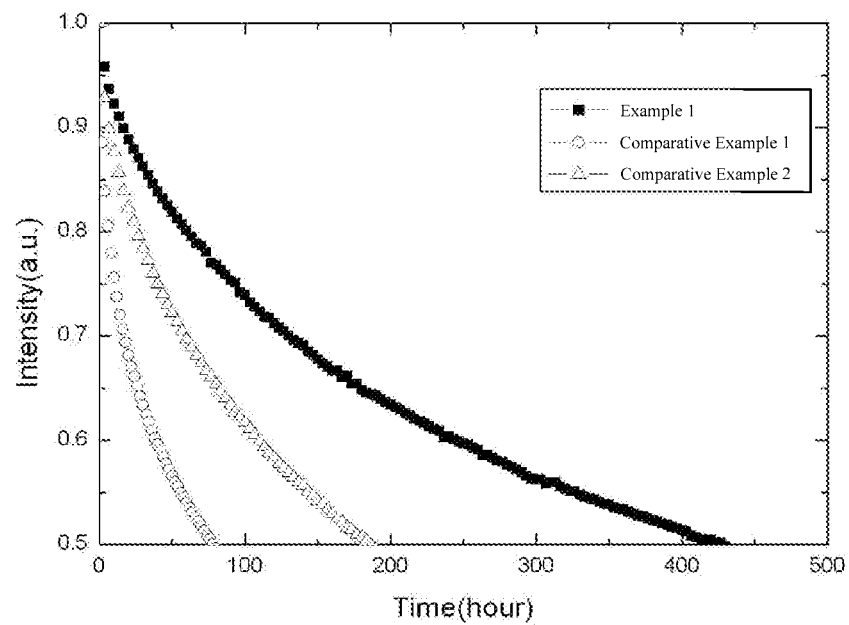
FIG. 5 is a graph, showing the lifetime comparison of different devices of example 1

The following Table 1 exhibits the characteristics of these devices of Example 1 and Comparative example 1 and 2, and the corresponding graphs are shown in FIG. 5.

TABLE 1

| Devices | Device structure of the luminescent layer | Lifetime at the same initial luminance (h) | Efficiency (cd/A) |
|---|---|---|---|
| Example 1 | BH1:20%NPB:5%BD1(10 nm)/BH1:5%BD1(15 nm) | 428 | 5.9 |
| Comparative example 1 | BH1:20%NPB:5%BD1(25 nm) | 132 | 4.5 |
| Comparative example 2 | BH1:5%BD1(25 nm) | 77 | 6.1 |

It can be seen from Table 1 and FIG. 5 that the device lifetime of Example 1 is improved markedly compared to that of Comparative example 1 wherein the device has only blue luminescent layer 1 with host A, and Comparative example 2 wherein the device has only blue luminescent layer 2 with host B. Additionally, the efficiency of Example 1 is not decreased so much as higher than the devices with only blue luminescent layer 1 or 2.

EXAMPLE 2

The device has the following device structure:

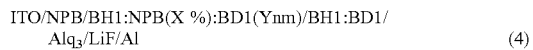

ITO/NPB/BH1:NPB(X %):BD1(Ynm)/BH1:BD1/Alq$_3$/LiF/Al      (4)

The device of device structure (4) is fabricated by the following procedures successively:

The device of device structure (4) is fabricated with the same procedures as above described towards the device structure (1), except for the weight ratio of NPB and BD1 to BH1 and the total thickness of the blue light emitting layer 1, wherein the weight ratio of NPB to BH1 is X % and the layer thickness is Ynm.

The following Table 2 exhibits the characteristics of these devices with different weight ratio and thickness of Example 2.

TABLE 2

| Device structure of the luminescent layer | Xwt % | Y (nm) | Lifetime (h) | Efficiency (cd/A) |
|---|---|---|---|---|
| BH1:NPB(20%):BD1(3%)(10 nm)/BH1:BD1 | 20 | 10 | 500 | 6 |
| BH1:NPB(40%):BD1(3%)(10 nm)/BH1:BD1 | 40 | 10 | 200 | 5.6 |
| BH1:NPB(60%):BD1(3%)(10 nm)/BH1:BD1 | 60 | 10 | 200 | 4 |
| BH1:NPB(20%):BD1(3%)(20 nm)/BH1:BD1 | 20 | 20 | 250 | 5 |
| BH1:NPB(40%):BD1(3%)(20 nm)/BH1:BD1 | 40 | 20 | 200 | 4.5 |
| BH1:NPB(60%):BD1(3%)(20 nm)/BH1:BD1 | 60 | 20 | 150 | 3.5 |

It can be seen from Table 2, the longest lifetime is obtained at the following condition: the weight ratio of NPB and BD1 to BH1 is 20% and 3% respectively, and the layer thickness of the blue light emitting layer 1 is 10 nm The marked lifetime improvement of the device having compound blue luminescent layer according to the above examples and comparative examples, may be attributed to the following reasons:

The first, effectively widening the blue emission zone can frequently prolong the lifetime of devices. Commonly, there is energy barrier, carriers mainly accumulated at the interface of HTL/BH1:BD (hole-transporting layer represented by HTL, blue host represented by BH1, blue dopant represented by BD), and uncommonly, a compound blue luminescent layer is introduced in the present invention, wherein the blue luminescent layer 1 can transport holes and electrons to the interface of BH$_1$:BH$_2$:BD/BH$_1$:BD, due to the host A of blue luminescent layer 1 containing not only hole-transporting material but also electron-transporting material (hole-transporting layer represented by HTL, blue host with electron-transporting characteristics represented by BH1, blue host with hole-transporting characteristics represented by BH2, and blue dopant represented by BD), so the recombination zone was extended to two interfaces of HTL/BH$_1$:BH$_2$:BD and BH$_1$:BH$_2$:BD/BH$_1$:BD, and the broadening of the emission zone resulted in the device having the longest lifetime. Meanwhile, the concentration of the dopant of blue light emitting layer 1 is high enough for forming continuous energy level, which effectively increase the carriers transporting, and thus, improving the device lifetime and efficiency.

Secondly, if the unrecombined holes enter the electron transporting layer Alq$_3$, they will form the unstable Alq$_3$ cationic species that will decrease the stability of the device. But in the present invention, the blue luminescent layer 2 is inserted between the Alq$_3$ layer and the blue luminescent layer 1 and the holes could be blocked and consumed by recombination in the blue light emitting layer 2. There are fewer holes to inject into Alq$_3$, which prevents the formation of Alq3$^+$, so the stability and efficiency was enhanced.

Thirdly, comparing to comparative example 1 or 2 only with either blue light emitting layer 1 or blue light emitting layer 2, the blue emission of the device of example 1 came from the compound blue emitting structure which consisted of the blue luminescent layer 1 and 2, thus both of that were complementary to each other during the course of device decay which prolonged the device lifetime.

Finally, the introducing of the host A caused the enhancement of vitrification temperature. Such as NPB, its vitrification temperature is low generally, however, that was enhanced because of the doping with other materials in the blue luminescent layer 1, which improved the heat stability of the whole device.

EXAMPLE 3

Another blue light emitting device using different blue material is reported in Example 3, and the device structure, same as Example 1, is showed in FIG. 1. The devices also employ compound luminescent layer, wherein the electron-transporting material of blue luminescent layer 1 makes use of BAlq, and the hole-transporting material makes use of NPB, while blue dopant is TBPe. The BAlq and TBPe are also used in blue luminescent layer 2 as host and dopant respectively. The device has the following device structure:

ITO/NPB/BAlq:NPB:TBPe/BAlq:TBPe/Alq$_3$/LiF/Al     (5)

The device of device structure (5) is fabricated by the procedure similar to Example 1

COMPARATIVE EXAMPLE 3

The device has the following device structure:

ITO/NPB/BAlq:TBPe/Alq$_3$/LiF/Al     (6)

The device of device structure (6) is fabricated by the following procedures successively:

The device of device structure (6) is fabricated with the same procedures as above described towards the device structure (5), except for cancelling the blue light emitting layer 1.

COMPARATIVE EXAMPLE 4

The device has the following device structure:

ITO/NPB/BAlq:NPB:TBPe/Alq$_3$/LiF/Al     (7)

The device of device structure (7) is fabricated by the following procedures successively:

The device of device structure (7) is fabricated with the same procedures as above described towards the device structure (5), except for cancelling the blue light emitting layer 2.

Figure 6:
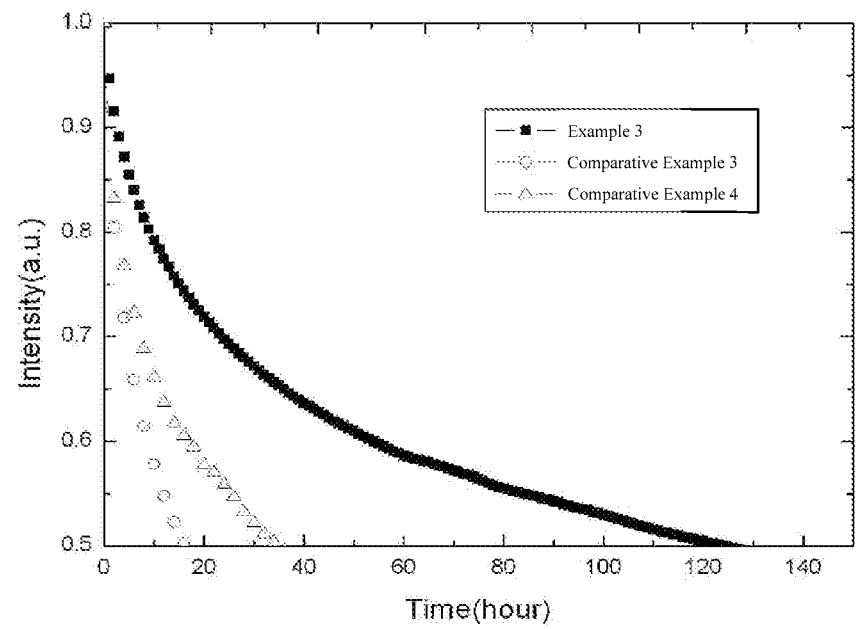
FIG. 6 is a graph, showing the lifetime comparison of different devices of example 3

The following Table 3 exhibits the characteristics of these devices of Example 3 and Comparative example 3 and 4, and the corresponding graphs are shown in FIG. 6.

TABLE 3

| Devices | Device structure of the luminescent layer | Lifetime at the same initial luminance (h) | Efficiency (cd/A) |
|---|---|---|---|
| Example 3 | BAlq:20%NPB:3%TBPe(10 nm)/BAlq:3%TBPe(15 nm) | 125 | 4.3 |
| Comparative example 3 | BAlq:3%TBPe(25 nm) | 16.3 | 4.4 |
| Comparative example 4 | BAlq:20%NPB:3%TBPe(25 nm) | 35 | 2.3 |

It can be seen from Table 3 and FIG. 6 that the device lifetime of example 3 is improved markedly compared to that of Comparative example 3 and 4. Additionally, the efficiency of Example 3 is not decreased.

EXAMPLE 4

Figure 2:
FIG. 2 is a cross-sectional representation of one embodiment of the structure of the green organic light emitting device, comprising.

A green light emitting device is reported in Example 4 and the device structure is shown in FIG. 2, wherein the luminescent layer 09 is compound green emitting layer containing two layers: layer 10 and layer 11. The green emitting layer 1(10) contains host A doped with green dopant where the host A is formed by two kinds of materials with different transporting characteristics, one of which is electron-transporting material BAlq, the other is hole-transporting material NPB, and the green dopant is C545T. The green emitting layer 2(11) is formed by a host B and a green dopant, where the host B is electron-transporting material BAlq and the green dopant is C545T, and the device has the following device structure:

ITO/NPB/BAlq:NPB:C545T/BAlq:C545T/Alq$_3$/LiF/Al     (8)

The device of device structure (8) is fabricated by the procedure similar to Example 1.

COMPARATIVE EXAMPLE 5

The device has the following device structure:

ITO/NPB/BAlq:C545T/Alq$_3$/LiF/Al     (9)

The device of device structure (9) is fabricated by the following procedures successively:

The device of device structure (9) is fabricated with the same procedures as above described towards the device structure (8), except for cancelling the green emitting layer 1.

COMPARATIVE EXAMPLE 6

The device has the following device structure:

ITO/NPB/BAlq:NPB:C545T/Alq$_3$/LiF/Al     (10)

The device of device structure (10) is fabricated by the following procedures successively:

The device of device structure (10) is fabricated with the same procedures as above described towards the device structure (8), except for cancelling the green emitting layer 2.

Figure 7:
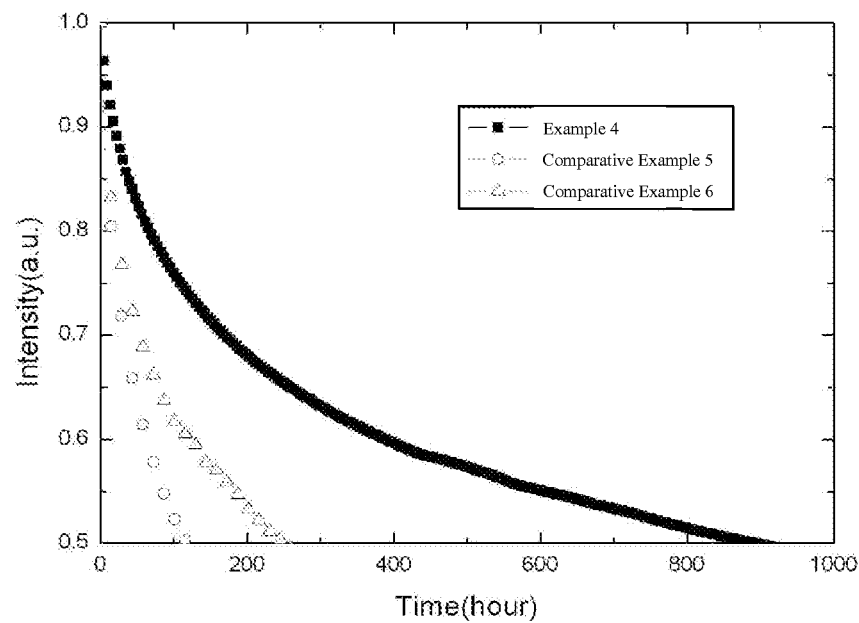
FIG. 7 is a graph, showing the lifetime comparison of different devices of example 4

The following Table 4 exhibits the characteristics of these devices of Example 4 and Comparative example 5 and 6, and the corresponding graphs are shown in FIG. 7.

TABLE 4

| Device | Device structure of the luminescent layer | Lifetime at the same initial luminance (h) | Efficiency (cd/A) |
|---|---|---|---|
| Example 4 | BAlq:20%NPB:2%C545T(10 nm)/BAlq:2%C545T(15 nm) | 895 | 10.1 |
| Comparative example 5 | BAlq:2%C545T(25 nm) | 118 | 10.5 |
| Comparative example 6 | BAlq:20%NPB:2%C545T(25 nm) | 252 | 8.1 |

It can be seen from Table 4 and FIG. 7 that the device lifetime of Example 4 is improved markedly compared to that of Comparative example 5 and 6. Additionally, the efficiency of Example 4 is not decreased.

EXAMPLE 5

Figure 3:
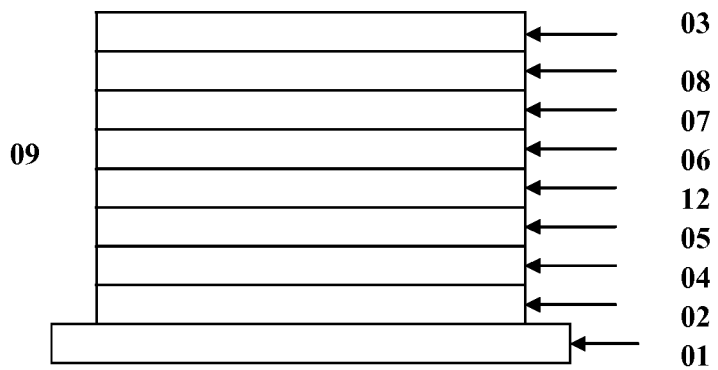
FIG. 3 is a cross-sectional representation of one embodiment of the structure of the white organic light emitting device with two luminescent centers, comprising.

A white organic light emitting device with two luminescent centers is reported in Example 5 and the device structure is shown in FIG. 3, wherein the luminescent layer 09 includes yellow emitting layer 12 and compound blue emitting layer containing two layers: blue emitting layer 1(06) and blue emitting layer 2(07). The yellow emitting layer 12 is formed by hole-transporting material NPB and yellow dopant (such as rubrene). The blue emitting layer 2(07) includes electron-transporting material BH1 and blue dopant BD1, and the blue emitting layer 1(06) includes host A doped with green dopant where the host A is formed by two kinds of materials with different transporting characteristics, one of which is electron-transporting material BH1, the other is hole-transporting material NPB. The preferable device has the following device structure:

ITO/NPB/NPB:rubrene/BH1:NPB:BD1/BH1:BD1/
Alq$_3$/LiF/Al           (11)

The white organic light emitting device of device structure (11) is fabricated by the following procedures successively:

1) A transparent glass substrate is cleaned ultrasonically with boiling scour water and deionized (DI) water. Then the substrate is dried under infra-red lamp. An anode material is deposited on the cleaned glass as an anode layer and the thickness of it is 180 nm.

2) The cleaned anode film-coated glass substrate is put in the vacuum of about 1×10$^{-5}$ Pa, then a NPB film is vapor-deposited as a hole-transporting layer on the anode layer. The deposition rate is about 0.1 nm/s and the resulting NPB layer thickness is about 20 nm And then a yellow emitting film is vapor-deposited on the hole-transporting layer through the method of evaporating two materials at the same time. The deposition rate of NPB is 0.2 nm/s and the weight ratio of rubrene to NPB is 2 wt %, and the thickness of this layer is 15 nm.

3) The blue emitting layer 1 is vapor-deposited on the yellow emitting layer through the method of evaporating three materials at the same time. The weight ratio of NPB and BD1 to BH1 is respectively 20% and 3% and the thickness of this layer is 10 nm.

4) The blue emitting layer 2 is subsequently vapor-deposited on the blue emitting layer 1 through the method of evaporating two materials at the same time. The deposition rate of BH1 is 0.2 nm/s and the weight ratio of BD1 to BH1 is 3%, and the thickness of this layer is 20 nm.

5) An Alq$_3$ film is subsequently vapor-deposited on the second blue emitting layer as electron-transporting layer. The deposition rate is 0.2 nm/s and the thickness of it is 50 nm.

6) Finally, a LiF layer and an Al layer, in sequence, are vapor-deposited as cathode on the above layers. The deposition rate of LiF is 0.01~0.02 nm/s, and the layer thickness is 0.7 nm The deposition rate of Al is 2.0 nm/s, and the thickness of it is 150 nm.

COMPARATIVE EXAMPLE 7

The device has the following device structure:

ITO/NPB/NPB:rubrene/BH1:BD1/Alq$_3$/LiF/Al           (12)

The white organic light emitting device of device structure (12) is fabricated by the following procedures successively:

The device of device structure (12) is fabricated with the same procedures as above described towards the device structure (11), except for cancelling the green emitting layer 1.

COMPARATIVE EXAMPLE 8

The device has the following device structure:

ITO/NPB/NPB:rubrene/BH1:NPB:BD1/Alq$_3$/LiF/Al           (13)

The white organic light emitting device of device structure (13) is fabricated by the following procedures successively:

The device of device structure (13) is fabricated with the same procedures as above described towards the device structure (11), except for cancelling the green emitting layer 2.

Figure 8:
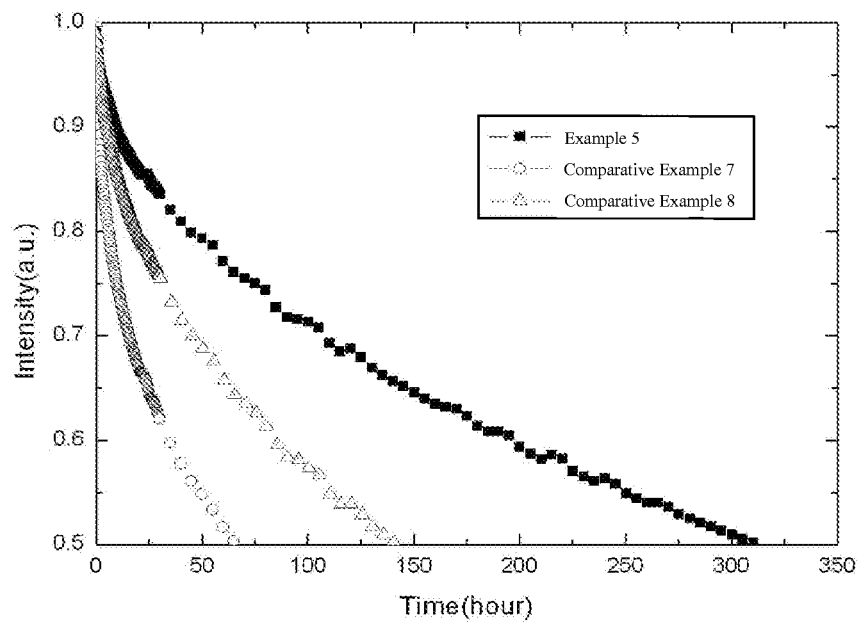
FIG. 8 is a graph, showing the lifetime comparison of different devices of example 5

The following Table 5 exhibits the characteristics of these devices of Example 5 and Comparative example 7 and 8, and the corresponding graphs are shown in FIG. 8.

TABLE 5

| Device | Device structure of the luminescent layer | Lifetime (h) | Efficiency (cd/A) | Color |
|---|---|---|---|---|
| Example 5 | NPB:rubrene/BH1:20%NPB:3%BD1(10 nm)/BH1:3%BD1(20 nm) | 312 | 10 | White |
| Comparative example 7 | NPB:rubrene/BH1:3%BD1(20 nm) | 66 | 10.3 | White on the yellow side |
| Comparative example 8 | NPB:rubrene/BH1:20%NPB:3%BD1(20 nm) | 142 | 8.3 | White |

EXAMPLE 6

The device has the following device structure:

ITO/NPB/NPB:DCM/BAlq:NPB(X %):TBPe(Ynm)/
BAlq:TBPe/Alq$_3$/LiF/Al           (14)

The white organic light emitting device of device structure (14) is fabricated by the following procedures successively:

The device of device structure (14) is fabricated with the same procedures as above described towards Example 5, except for different materials' weight ratio and total thickness, wherein the weight ratio of NPB and TBPe to BAlq is X % and 3% respectively, and the layer thickness is Ynm.

The following Table 6 exhibits the characteristics of these devices with different weight ratio and thickness of Example 6.

TABLE 6

| Device structure of the compound blue emitting layer | Xwt % | Y (nm) | Lifetime (h) | Efficiency (cd/A) | Color |
| --- | --- | --- | --- | --- | --- |
| BAlq:NPB(20%):TBPe(3%)(10 nm)/BAlq:TBPe | 20 | 10 | 803 | 8 | White |
| BAlq:NPB(40%):TBPe(3%)(10 nm)/BAlq:TBPe | 40 | 10 | 507 | 7.5 | White |
| BAlq:NPB(60%):TBPe(3%)(10 nm)/BAlq:TBPe | 60 | 10 | 411 | 6 | White on the blue side |
| BAlq:NPB(20%):TBPe(3%)(20 nm)/BAlq:TBPe | 20 | 20 | 453 | 7 | White |
| BAlq:NPB(40%):TBPe(3%)(20 nm)/BAlq:TBPe | 40 | 20 | 387 | 6.5 | White |
| BAlq:NPB(60%):TBPe(3%)(20 nm)/BAlq:TBPe | 60 | 20 | 344 | 5.5 | White on the blue side |

It can be seen from Table 6 that the longest lifetime is obtained at the following condition: the weight ratio of NPB and TPBe to BAlq is 20% and 3% respectively, and the layer thickness of the blue light emitting layer 1 is 10 nm

EXAMPLE 7

Figure 4:
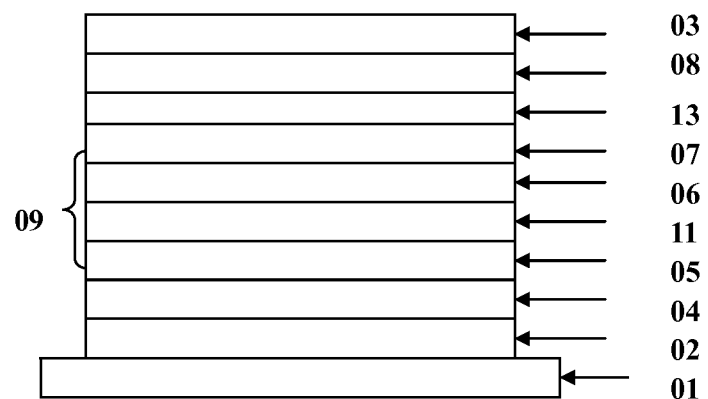
FIG. 4 is a cross-sectional representation of one embodiment of the structure of the white organic light emitting device with three luminescent centers, comprising.

Another white organic light emitting device with three luminescent centers is reported in Example 7 and the device structure is shown in FIG. 4, wherein the luminescent layer 09 includes green emitting layer 11, compound blue luminescent layer containing the blue emitting layer 1(06) and the blue emitting layer 2(07), and the red emitting layer 13. wherein the green emitting layer 11 includes NPB as host and Ir(ppy)$_3$ as green dopant; the blue emitting layer 2(07) includes electron-transporting material BAlq as host and TBPe as blue dopant; the emitting layer 1(06) includes host A doped with blue dopant and the host A is formed by two kinds of materials with different transporting characteristics; the red emitting layer includes Alq$_3$ as host and DCJTB or Ir(piq)$_2$(acac) as red dopant. The preferable device has the following device structure:

ITO/NPB/NPB:C545T/BAlq:NPB:TBPe/BAlq:TBPe/
Alq$_3$:Ir(piq)$_2$(acac)/Alq$_3$/LiF/Al     (15)

The white organic light emitting device of device structure (15) is fabricated by the following procedures successively:

1) A transparent glass substrate is cleaned ultrasonically with boiling scour water and deionized (DI) water. Then the substrate is dried under infra-red lamp. An anode material is deposited on the cleaned glass as an anode layer and the thickness of it is 180 nm.

2) The cleaned anode film-coated glass substrate is put in the vacuum of about 1×10$^5$ Pa, then a NPB film is vapor-deposited as a hole-transporting layer on the anode layer. The deposition rate is about 0.1 nm/s and the resulting NPB layer thickness is about 20 nm And then a green emitting film is vapor-deposited on the hole-transporting layer through the method of evaporating two materials at the same time. The deposition rate of NPB is 0.2 nm/s and the weight ratio of C545T to NPB is 2 wt %, and the thickness of this layer is 15 nm.

3) The blue emitting layer 1 is vapor-deposited on the green emitting layer through the method of evaporating three materials at the same time. The weight ratio of NPB and TBPe to BAlq is respectively 20% and 3% and the thickness of this layer is 20 nm.

4) The blue emitting layer 2 is subsequently vapor-deposited on the blue emitting layer 2 through the method of evaporating two materials at the same time. The weight ratio of TBPe to BAlq is 3%, and the thickness of this layer is 20 nm.

5) A red emitting film is vapor-deposited on the blue emitting layer 2 through the method of evaporating two materials at the same time. The weight ratio of Ir(piq)$_2$(acac) to Alq$_3$ is 5%, and the thickness of this layer is 10 nm.

6) An Alq$_3$ film is subsequently vapor-deposited on the red emitting layer as electron-transporting layer. The deposition rate is 0.2 nm/s and the thickness of it is 50 nm.

7) Finally, a LiF layer and an Al layer, in sequence, are vapor-deposited as cathode on the above layers. The deposition rate of LiF is 0.01~0.02 nm/s, and the layer thickness is 0.7 nm. The deposition rate of Al is 2.0 nm/s, and the thickness of it is 150 nm.

COMPARATIVE EXAMPLE 9

The device has the following device structure:

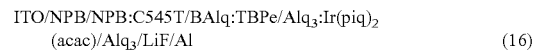

ITO/NPB/NPB:C545T/BAlq:TBPe/Alq$_3$/Ir(piq)$_2$
(acac)/Alq$_3$/LiF/Al     (16)

The white organic light emitting device of device structure (16) is fabricated by the following procedures successively:

The device of device structure (16) is fabricated with the same procedures as above described towards device (15), except for cancelling the blue emitting layer 1.

COMPARATIVE EXAMPLE 10

The device has the following device structure:

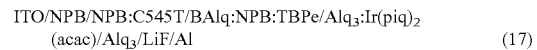

ITO/NPB/NPB:C545T/BAlq:NPB:TBPe/Alq$_3$:Ir(piq)$_2$
(acac)/Alq$_3$/LiF/Al     (17)

The device of device structure (17) is fabricated with the same procedures as above described towards device (15), except for cancelling the blue emitting layer 2.

Figure 9:
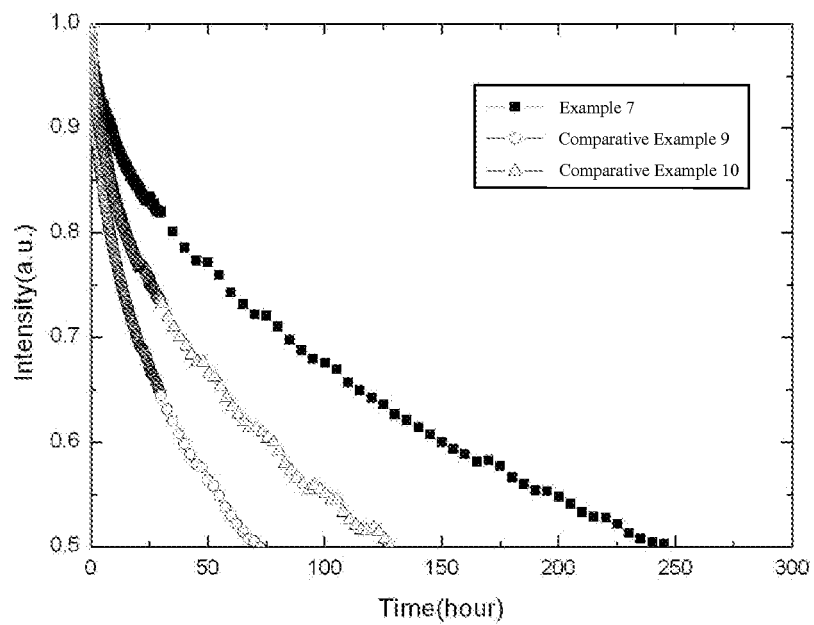
FIG. 9 is a graph, showing the lifetime comparison of different devices of example 7

The following Table 7 exhibits the characteristics of these devices of Example 7 and Comparative example 9 and 10, and the corresponding graphs are shown in FIG. 9.

TABLE 7

| Device | Device structure of the luminescent layer | Lifetime (h) | Efficiency (cd/A) | Color |
|---|---|---|---|---|
| Example 7 | NPB:C545T/BAlq:20%NPB:3%TBPe(20 nm)/BAlq:3%TBPe(20 nm)/Alq$_3$:Ir(piq)$_2$(acac) | 248 | 14.8 | White |
| Comparative example 9 | NPB:C545T/BAlq:3%TBPe(20 nm)/Alq$_3$:Ir(piq)$_2$(acac) | 72 | 15 | White |
| Comparative example 10 | NPB:C545T/BAlq:20%NPB:3%TBPe(20 nm)/Alq$_3$:Ir(piq)$_2$(acac) | 128 | 11 | White on the red side |

It can be seen from Table 7 and FIG. 9 that the device lifetime of Example 7 is improved markedly compared to that of Comparative example 9 and 10. Additionally, the device efficiency of Example 7 is not decreased.

EXAMPLE 8

A white organic light emitting device with two luminescent centers is reported in Example 8, wherein the luminescent layer includes yellow emitting layer, the blue emitting layer 1 and the blue emitting layer 2, wherein the blue emitting layer 1 contains a host B with both the hole-transporting characteristic and the electron-transporting characteristic.

The preferable device has the following device structure:

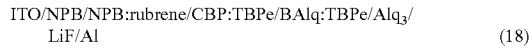
ITO/NPB/NPB:rubrene/CBP:TBPe/BAlq:TBPe/Alq$_3$/
    LiF/Al         (18)

The device of device structure (18) is fabricated with the same procedures as above described towards Example 5, except for changing the blue emitting layer 1 which contains a host B CBP. The deposition rate of CBP is 0.1 nm/s and the weight ratio of TBPe is 3%. The thickness of the blue emitting layer 1 and the blue emitting layer 2 is 10 nm and 20 nm respectively.

Meanwhile, the following comparative devices are fabricated with the same procedures:

ITO/NPB/NPB:rubrene/BAlq:TBPe/Alq$_3$/LiF/Al         (19)

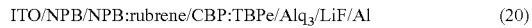
ITO/NPB/NPB:rubrene/CBP:TBPe/Alq$_3$/LiF/Al         (20)

The following Table 8 exhibits the characteristics of these devices.

TABLE 8

| Device structure of the luminescent layer | Lifetime (h) | Efficiency (cd/A) | color |
|---|---|---|---|
| NPB:rubrene/CBP:3%TBPe(10 nm)/BAlq:3%TBPe(20 nm) | 775 | 9 | White |
| NPB:rubrene/CBP:3%TBPe(20 nm)/BAlq:3%TBPe(20 nm) | 601 | 7.9 | White |
| NPB:rubrene/BAlq:3%TBPe(20 nm) | 497 | 9 | White |
| NPB:rubrene/CBP:3%TBPe(10 nm) | 452 | 7.5 | White on the yellow side |

It can be seen from Table 8 that the lifetime of the device using a host B with both the hole-transporting characteristic and the electron-transporting characteristic in the blue emitting layer 1 and blue emitting layer 2 is improved markedly compared to that of comparative devices, meanwhile, the device efficiency of Example 8 is not decreased. The longest lifetime is obtained at the following condition: the weight ratio of TBPe is 3%, and the layer thickness of the blue light emitting layer 1 is 10 nm.

Additionally, the dopant of the blue emitting layer can also be either BCzVBi, BCzVB, DPAVBi, DPAVB, BDAVBi or N-BDAVBi.

EXAMPLE 9

A white organic light emitting device including a compound blue emitting layer is reported in Example 9, wherein the blue emitting layer 1 and blue emitting layer 2 both contain a yellow dye. The blue emitting layer 1 contains host A and a blue dopant, and the host A includes an electron-transporting material and a hole-transporting material. The blue emitting layer 2 contains an electron-transporting material and a blue dopant.

The preferable device has the following device structure:

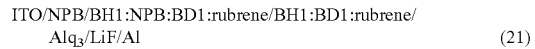
ITO/NPB/BH1:NPB:BD1:rubrene/BH1:BD1:rubrene/
    Alq$_3$/LiF/Al         (21)

The white organic light emitting device of device structure (21) is fabricated by the following procedures successively:

The device above is fabricated with the same procedures as above described towards Examples, and the differences are the blue emitting layer 1 through the method of evaporating four materials at the same time and the thickness of it is 10 nm. The blue emitting layer 2 through the method of evaporating three materials at the same time and the thickness of it is 15 nm.

Meanwhile, the following comparative devices are fabricated with the same procedures:

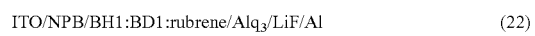
ITO/NPB/BH1:BD1:rubrene/Alq$_3$/LiF/Al         (22)

ITO/NPB/BH1:NPB:BD1:rubrene/Alq$_3$/LiF/Al         (23)

Figure 10:
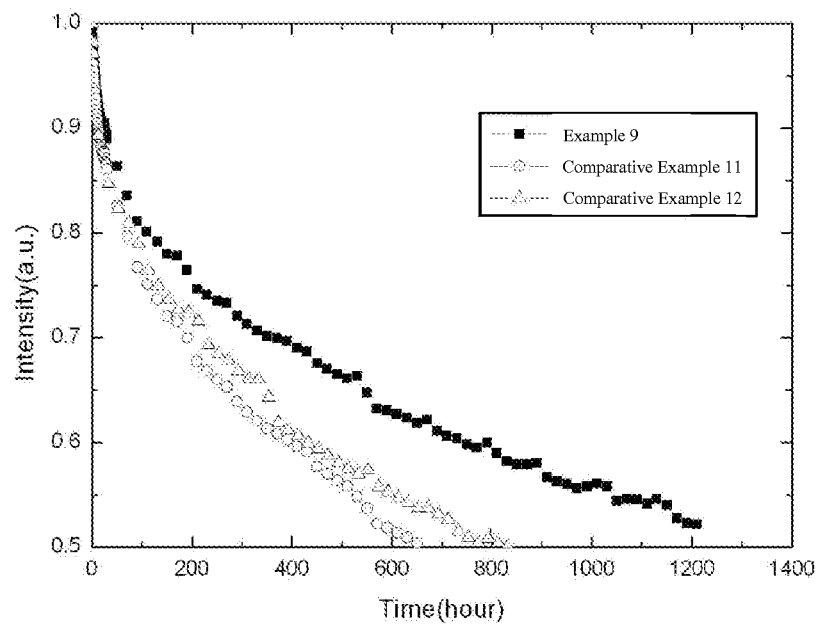
FIG. 10 is a graph, showing the lifetime comparison of different devices of example 9

The following Table 9 exhibits the characteristics of these devices of Example 9 and Comparative examples, and the corresponding graphs are shown in FIG. 10.

TABLE 9

| Device | Device structure of the luminescent layer | Lifetime at the same initial luminance (h) | Efficiency (cd/A) | Color |
| --- | --- | --- | --- | --- |
| Example 9 | BH1:20%NPB:5%BD1:0.5%rubrene(10 nm)/BH1:5%BD1:0.5%rubrene(15 nm) | 1400 | 11.3 | White |
| Comparative example 11 | BH1:5%BD1:1%rubrene(25 nm) | 663 | 11.8 | White |
| Comparative example 12 | BH1:20%NPB:5%BD1:1%rubrene(25 nm) | 834 | 9.6 | White |

The invention claimed is:

1. An organic light emitting device, including an anode, a cathode and an organic white-light-emitting electroluminescent medium disposed between the anode and the cathode, wherein the organic white-light-emitting electroluminescent medium comprises a compound monochromatic luminescent layer, which includes a first luminescent sublayer comprising host A doped with a monochromatic dopant and a second luminescent sublayer comprising host B doped with a monochromatic dopant,
wherein the host A includes two kinds of materials with different transporting characteristics, one being a hole-transporting material, and the other being an electron-transporting material, and
wherein the dopant of host A is the same as the dopant of host B.

2. The organic light emitting device of claim 1, wherein both of the first and second sublayers of the compound monochromatic luminescent layer are blue emitting layers, green emitting layers, red emitting layers, or yellow emitting layers.

3. The organic light emitting device of claim 1, wherein the hole-transporting material includes triarylamine, carbazole derivatives and pyrazolin derivatives.

4. The organic light emitting device of claim 1, wherein the electron-transporting material includes anthracene, oxadiazole derivative, metal chelates and conjugated polycyclic aromatic compounds.

5. The organic light emitting device of claim 1, wherein the host A consists of a single material with both the hole-transporting characteristic and the electron-transporting characteristic.

6. The organic light emitting device of claim 1, wherein the host B consists of a single material, and one of the two kinds of materials for host A is the same as the single material for host B.

7. The organic light emitting device of claim 1, wherein the hole-transporting material is represented by the following formula ①-③:

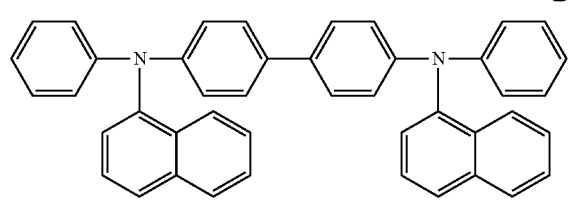

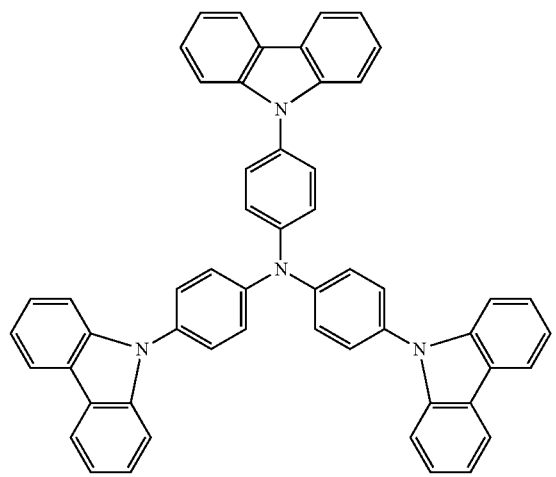

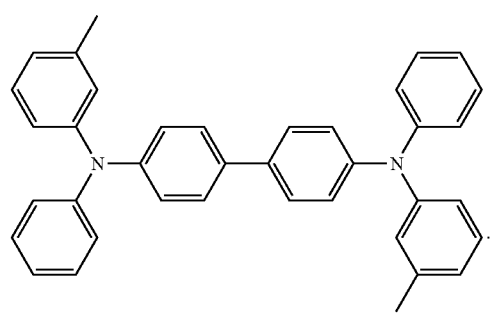

8. The organic light emitting device of claim 1, wherein one of the host A and the dopant thereof are the same as the host B and the dopant thereof.

9. The organic light emitting device of claim 1, wherein the organic electroluminescent medium includes a compound blue emitting layer, a green emitting layer and a red emitting layer.

10. The organic light emitting device of claim 1, wherein the organic electroluminescent medium includes a compound blue emitting layer and a yellow emitting layer.

11. The organic light emitting device of claim 1, wherein the electroluminescent medium includes compound green emitting layer, blue emitting layer and red emitting layer.

12. The organic light emitting device of claim 1, wherein the host A doped with monochromatic dopant further comprises an auxiliary material.

\* \* \* \* \*